United States Patent
Lam et al.

(10) Patent No.: US 7,751,217 B2
(45) Date of Patent: Jul. 6, 2010

(54) CONTENT ADDRESSABLE MEMORY USING PHASE CHANGE DEVICES

(75) Inventors: Chung H. Lam, Peekskill, NY (US); Brian L. Ji, Fishkill, NY (US); Robert K. Montoye, Rochester, MN (US); Bipin Rajendran, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 12/166,311

(22) Filed: Jul. 1, 2008

(65) Prior Publication Data

US 2010/0002481 A1    Jan. 7, 2010

(51) Int. Cl.
*G11C 15/00* (2006.01)
(52) U.S. Cl. ............... 365/49.1; 365/49.17; 365/49.18; 365/148; 365/163
(58) Field of Classification Search ............... 365/49.1, 365/49.17, 49.18, 163, 148
See application file for complete search history.

(56) References Cited

U.S. PATENT DOCUMENTS 7,173,838 B2 *   2/2007   Hanzawa et al. ........... 365/49.1
7,561,454 B2 *   7/2009   Perry et al. ................. 365/49.1
2009/0190386 A1 * 7/2009   Kim ........................ 365/49.17

* cited by examiner

*Primary Examiner*—Pho M. Luu
(74) *Attorney, Agent, or Firm*—Ido Tuchman; Vazken Alexanian

(57) ABSTRACT

Content addressable memory device utilizing phase change devices. An aspect of the content addressable memory device is the use of a comparatively lower power search-line access element and a comparatively higher power word-line access element. The word-line access element is only utilized during write operations and the search-line access element is only utilized during search operations. The word-line access element being electrically coupled to a second end of a phase change memory element and a word-line. The search-line access element also being electrically coupled to the second end of the phase change memory element and a search-line. The search-line being electrically coupled to a match-line. A bit-line is electrically coupled to a first end of the phase change memory element. Additionally, a complementary set of access elements, a complementary phase change memory element, a complementary search-line, and a complementary bit-line are also included in the content addressable memory device.

18 Claims, 4 Drawing Sheets

| Search-Line Value: | Phase Change Memory Element Value: | Match-Line Value: |
|---|---|---|
| 0 | 1 | No match |
| 1 | 0 | No match |
| 1 | 1 | Match |
| 0 | 0 | Match |

CONTENT ADDRESSABLE MEMORY USING PHASE CHANGE DEVICES

BACKGROUND OF THE INVENTION

1. Field of the Invention

The present invention relates to phase change memory, and more specifically to content addressable memory utilizing phase change memory and separate word-line and search-line access elements.

2. Description of Background

Content addressable memory (CAM) is a type of computer memory utilized in high speed searching applications. Most CAM devices utilize static random access memory (SRAM) as data storage devices (utilizing transistors to store data) and access transistors for match operations. Often in these CAM devices the access transistors large and power-intensive field effect transistors (FET).

Phase change material can also be utilized to store data for CAM devices. Information is stored in materials that can be manipulated into different phases. Each of these phases exhibits different electrical properties that can be used for storing information. The amorphous and crystalline phases of the phase change material are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. They typically contain a chalcogen (Periodic Table Group 16/VIA) and a more electropositive element. Selenium (Se) and tellurium (Te) are the two most common semiconductors in the group used to produce a chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used in a phase change material cell as long as they can retain separate amorphous and crystalline states.

SUMMARY OF THE INVENTION

One aspect of the invention is a content addressable memory cell. The content addressable memory cell includes a bit-line, a complementary bit-line, a phase change memory element, a complementary phase change memory element, a search-line access element, a word-line access element, a search-line, a word-line, a complementary search-line access element, a complementary word-line access element, a complementary search-line, and a match-line. The search-line access element and the complementary search-line access element include a field effect transistors (FET). The word-line access element and complementary word-line access element include, for example, a PN diode or a bipolar junction transistor (BJT). The word-line access element and complementary word-line access element require more power to operate than the search-line access element and complementary search-line access element. Additionally, the word-line access element and the complementary word-line access element are used only for writing operations. The search-line access element and the complementary search-line access element are used only for searching operations.

Another aspect of the invention is a content addressable memory device. The content addressable memory device comprise a plurality of content addressable memory cells arranged in an array, a plurality of bit-lines and a plurality of word-lines arranged in columns and rows, a plurality of word-line access elements, a plurality of complementary bit-lines, a plurality of complementary word-line access elements, a plurality of search-lines, a plurality of complementary search-lines, and a plurality of match-lines.

Each content addressable memory cell includes a phase change memory element and a complementary phase change memory element. The phase change memory element includes a first end and a second end. Similarly, the complementary phase change memory element includes a first end and a second end. The phase change memory element is configured to store a data bit and the complementary phase change memory element is configured to store a complementary data bit that is the inverse bit of the data bit.

Each bit-line is electrically coupled to the first end of at least one phase change memory element. At least one word-line access element is electrically coupled to each word-line. Each word-line access element is electrically coupled to the second end of one phase change memory element. Each complementary bit-line is electrically coupled to the first end of at least one complementary phase change memory element. At least one complementary word-line access element is electrically coupled to each word-line, with each complementary word-line access element electrically coupled to the second end of one complementary phase change memory element.

Each search-line is electrically coupled to at least one search-line access element. The search-line access element is electrically coupled to the second end of one phase change memory element. Each complementary search-line electrically is coupled to at least one complementary search-line access element. The complementary search-line access element is electrically coupled to the second end of one complementary phase change memory element. The plurality of match-lines are electrically coupled to at least one search-line and to the complementary search-line of the at least one search-line.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

The present invention is described with reference to embodiments of the invention. Throughout the description of the invention reference is made to FIGS. 1-3.

As described in detail below, an aspect of the current invention is a content addressable memory device utilizing phase change memory elements. The content addressable memory device is comprised of a plurality of content addressable memory cells. Each individual content addressable memory cell includes a search-line access element and a word-line access element. The search-line access element is activated during searching operations, while the word-line access element is activated during programming operations.

Also included in each individual content addressable memory cell are a phase change memory element and a complementary phase change memory element. Both the phase change memory element and the complementary phase change memory element are comprised of a phase change material, such as Germanium-Antimony-Tellurium (GST). Typically, the phase change memory element may be programmed to one of two states: a crystalline state or an amorphous state. For example, the crystalline state may represent a stored "0" value and the amorphous state may represent a stored "1" value. In the crystalline state, the phase change memory element exhibits a relatively low resistance. On the other hand, in the amorphous state, the phase change memory element has a relatively high resistance.

Changing a phase change memory element's state requires heating the material to a melting point and then cooling the material to one of the two states. A current is passed through the phase change memory element inducing ohmic heating and causing the phase change material to melt. Melting and gradually cooling down the phase change material in the phase change memory element allows time for the phase change material to form the crystalline state. Melting and abruptly cooling the phase change material in the phase change memory element quenches the phase change material into the amorphous state.

The complementary phase change memory element is programmed to the inverse state of the phase change memory element. For example, if the phase change memory element is in the crystalline state then the complementary phase change memory element is programmed to the amorphous state.

Figure 1:
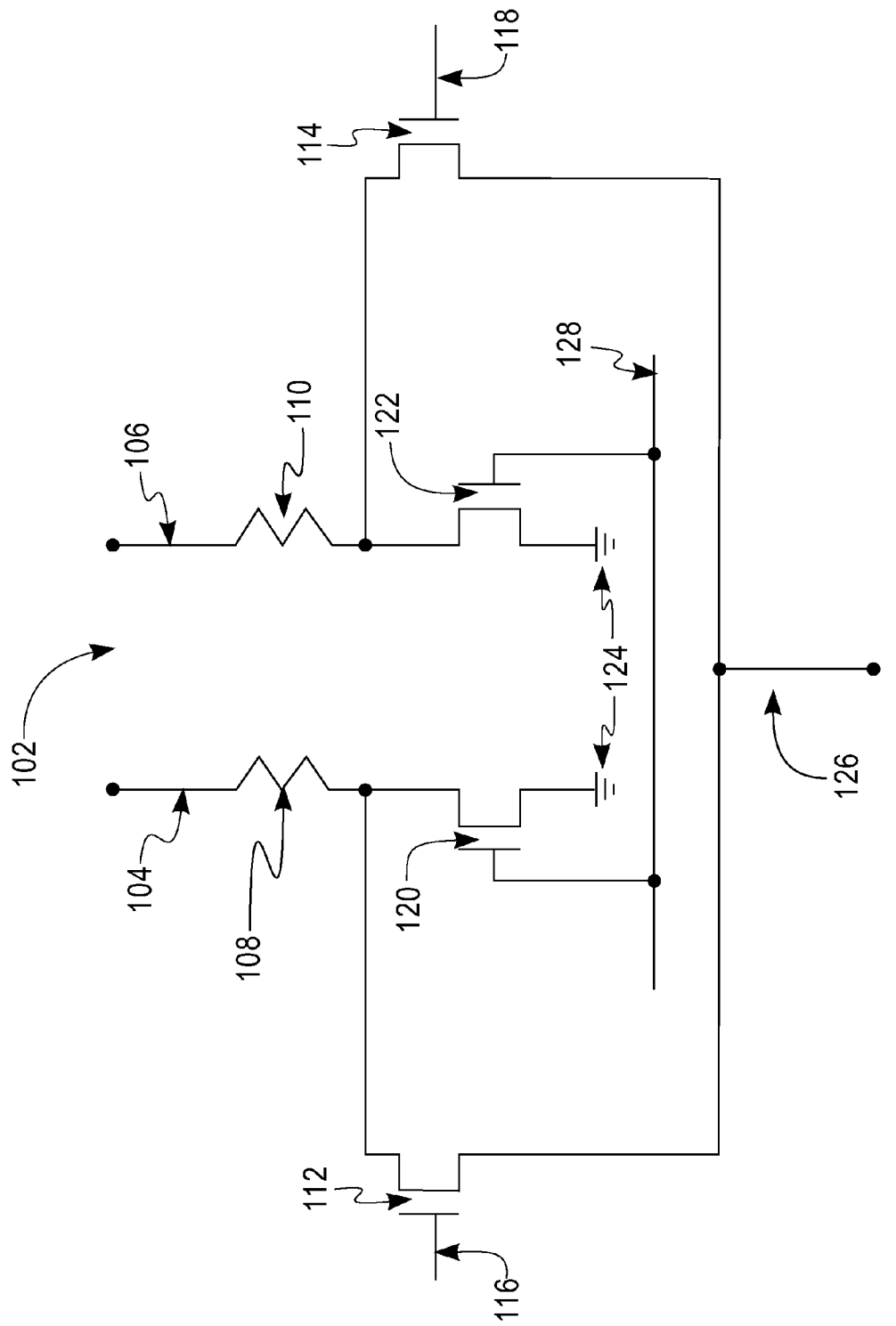
FIG. 1 illustrates a circuit diagram of a content addressable memory cell contemplated by the present invention.

In FIG. 1, an embodiment of the invention is illustrated. The content addressable memory cell 102 is comprised of a bit-line 104 a complementary bit-line 106, a phase change memory element 108, a complementary phase change memory element 110, a search-line access element 112, a complementary search-line access element 114, a search-line 116, a complementary search-line 118, a word-line access element 120, a complementary word-line access element 122, a word-line 128, a ground 124, and a match-line 126.

As shown, the bit-line 104 is electrically coupled to a first end of the phase change memory element 108. The complementary bit-line is electrically coupled to a first end of the complementary phase change memory element 110. The search-line access element 112 is electrically coupled to a second end of the phase change memory element 108 and the search-line 116. The complementary search-line access element 114 is electrically coupled to a second end of the complementary phase change memory element 110 and the complementary search-line 118. The word-line access element 120 is electrically coupled to the second end of the phase change memory element 108, the word-line 128, and the ground 124. The complementary word-line access element 122 is electrically coupled to the second end of the complementary phase change memory element 110, the word-line 128, and the ground 124. The search-line 116 and the complementary search-line 118 are electrically coupled to the match-line 126.

Figure 2A:
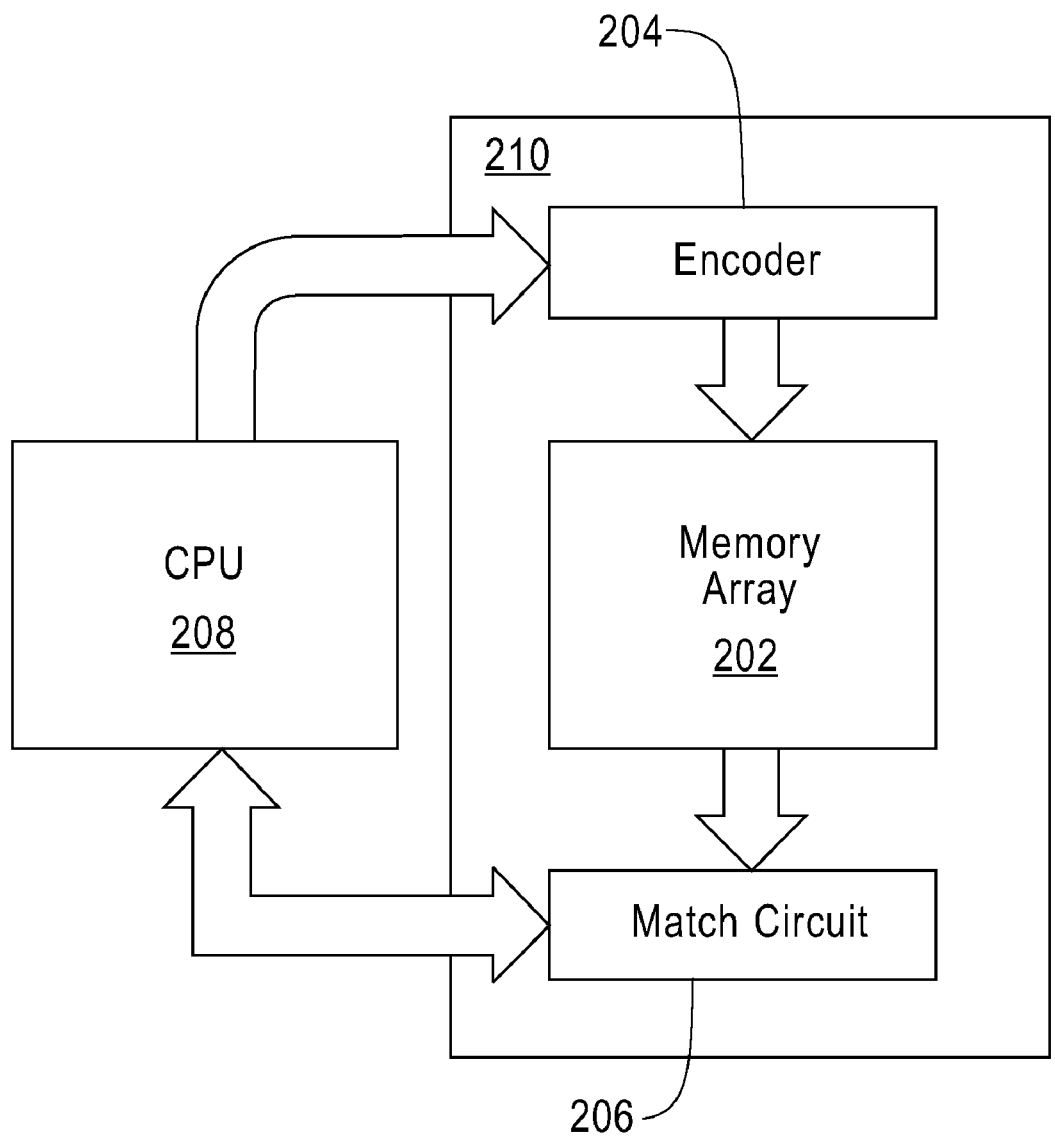
FIG. 2a illustrates information exchange between a content addressable memory device and a central processing unit.

In FIG. 2a, an operation diagram of the content addressable memory device 210 is shown. A central computing source 208 such as a central processing unit (CPU), an encoder 204, a memory array 202, and a match circuit 206 are shown. In one particular embodiment of the invention, the encoder 204 and the match circuit 208 are integrated into the content addressable memory device 210. In an alternate embodiment of the invention, the encoder 204 and the match circuit 208 are separate from the content addressable memory device 210.

Operation of the content addressable memory cell can be broken down into two processes: programming and searching. During the programming process, the encoder 204 receives desired storage data bits from the CPU 208 and programs the data bits into the memory array 202. During the searching process, the match circuit 206 receives desired search data bits from the CPU 208 and searches for the data bits in the memory array 202.

Referring back to FIG. 1, programming the content addressable memory cells involves storing the desired data bit in the phase change memory element 108 and the complementary data bit (the inverse of the data bit) in the complementary phase change memory element 110. During this operation, the encoder first sets the word-line 128 of the desired content addressable memory cell 102 to a relatively high voltage, thereby activating the word-line access element 120 and the complementary word-line access element 122.

In order to store a "1" (amorphous state in this particular embodiment of the invention) in the content addressable memory cell 102, the encoder sets the bit-line 104 to a relatively high voltage and the complementary bit-line 106 to a relatively low voltage. Current flows through and melts the phase change memory element 108 and the complementary phase change memory element 110. To store a data bit value of "1", the bit-line 104 is then turned off with an abrupt trailing edge and the phase change memory element 108 cools to the amorphous state. Meanwhile, the complementary bit-line 106 is turned off with a gradual trailing edge and the complementary phase change memory element 110 cools to the crystalline state. This causes the complementary data bit to store a representation of "0".

In order to store a "0" (crystalline state in this particular embodiment of the invention) in the content addressable memory cell 102, the inverse operations are performed. Specifically, the encoder sets the bit-line 104 to a relatively low voltage and the complementary bit-line 106 to a relatively high voltage. Charge flows through and melts the phase change memory element 108 and the complementary phase change memory element 110. The bit-line 104 is then turned off with a gradual trailing edge and the phase change memory element 108 cools to the "0" state. Meanwhile, the complementary bit-line 106 is turned off with an abrupt trailing edge and the complementary phase change memory element 110 cools to the "1" state.

To search for the content addressable memory cells in accordance with one embodiment of the invention, the bit-line 104 and the complimentary bit-line 106 are set to a "low voltage", the match-line 126 of the desired content addressable memory cell is precharged to a "high" voltage by the match circuit, while the search-line access elements 112 and the complementary search-line access element 114 are turned off. Also note that the word-line access element 120 and the complementary word-line access element 122 are not turned on. The search-line 116 is set to the data bit searched and the complementary search-line 118 is set to the complementary data bit searched. For example, if a "1" needs to be found, the search-line 116 is set to "1". If the data bit stored in the phase change memory element 108 is "0" and the search-line 116 is set to "1" then the match-line 126 is discharged through search-line access element 112. If the data bit stored in the phase change memory element 108 is "1" and the search-line 116 is set to "0" then the match-line 126 is discharged through complementary search-line access element 114. However, if the search-line 116 and the phase change memory element 108 possess the same setting, the match-line 126 remains pre-charged at high voltage indicating a match.

As stated above, the word-line 128 is only activated during the programming operations (requiring larger transistors), and the search-line 116 and the complementary search-line 118 are only activated during the searching operations (requiring smaller transistors). The word-line access element 120 and the complementary word-line access element 122 are required to be larger transistors able to allow sufficient current to flow in order to melt the phase change elements 108, 110. In one particular embodiment of the invention, the word-line access element 120 and the complementary word-line access element 122 are bipolar junction transistors (BJT). In an alternate embodiment of the invention, the word-line access element 120 and the complementary word-line access element 122 are PN diodes.

Large transistors are not required for searching operations. Therefore, the search-line access element 112 and the complementary search-line access element 114 can be small field effect transistors. By eliminating the use of high power transistors during the searching operations, power usage is reduced in the overall operation of the content addressable memory device.

Figure 2B:
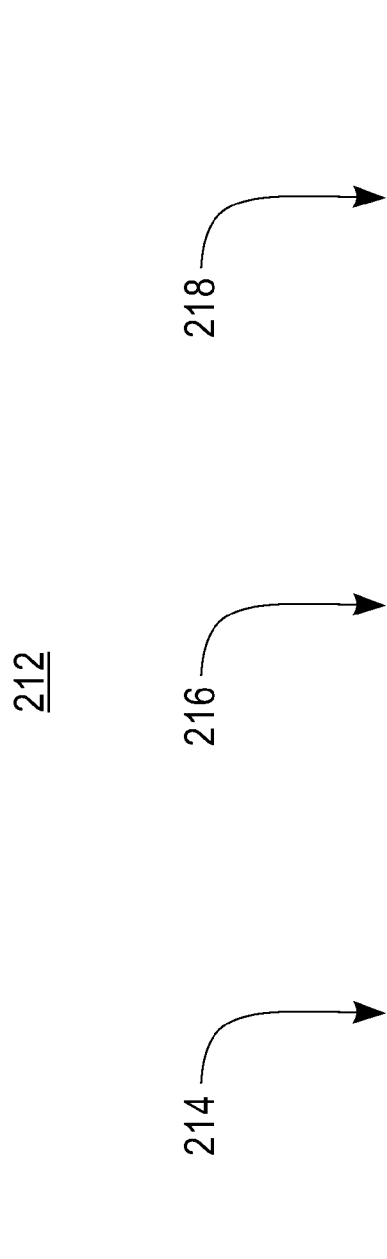
FIG. 2b illustrates a table of values for match-line charge or discharge.

FIG. 2b illustrates a table of values 212 relating to the search-line, the data bit stored in the phase change memory element, and the match-line. As stated above, when the search-line value 214 and the phase change memory element value 216 are not equal the match-line is discharged to low voltage by a discharging current 218 (No match). When the search-line value 214 and the phase change memory element value 216 are equal the match-line remain pre-charged at high voltage (Match).

Figure 3:
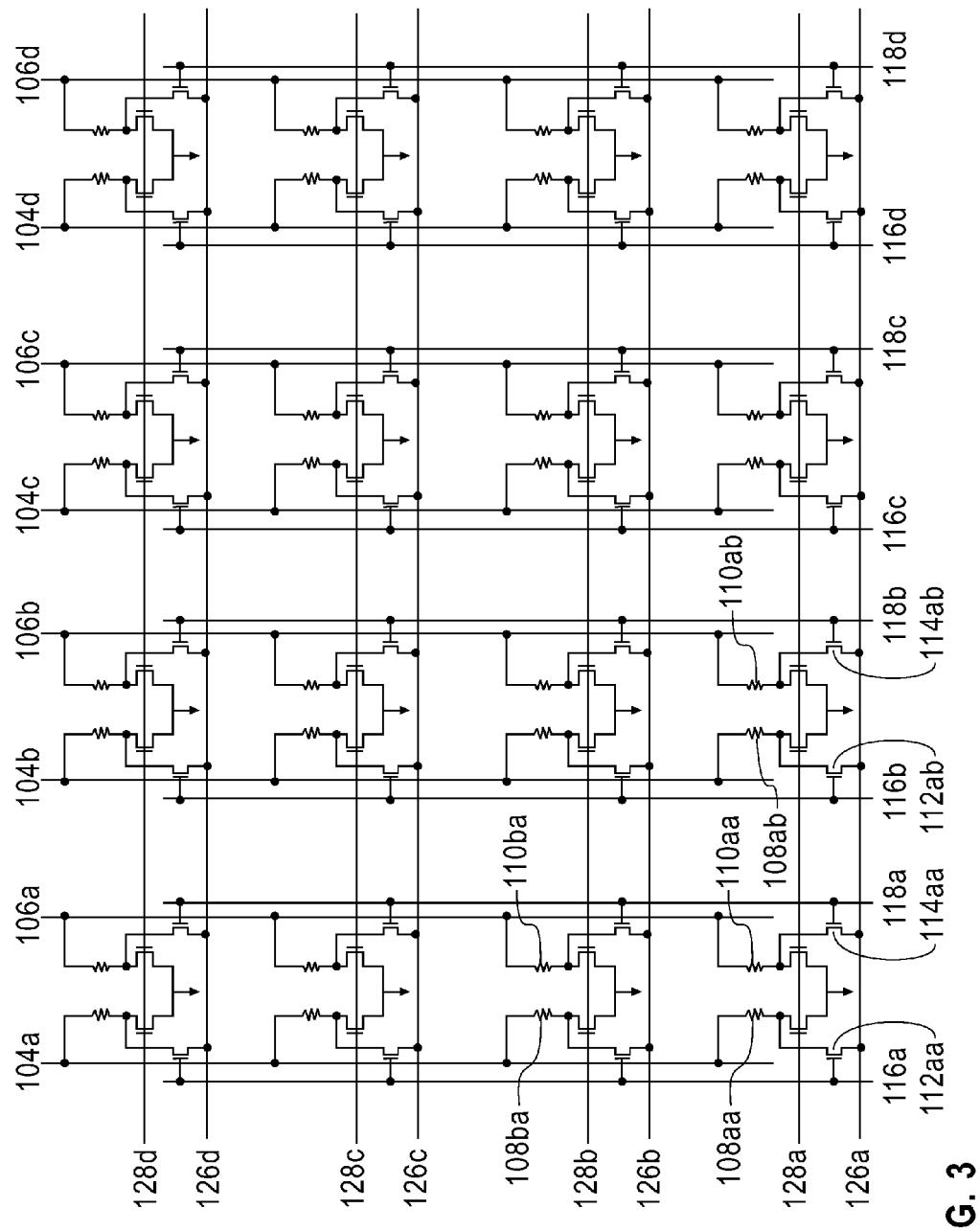
FIG. 3 illustrates a content addressable memory array contemplated by the present invention.

Now turning to FIG. 3, the memory array 202 of the phase change memory device is shown. It is more common, in data bit searches, to perform a "word" (a sequence of data bits) search by searching collections of content addressable memory cells in the memory array 202. As illustrated, each match-line 126 runs through the same content addressable memory cells as a paired word-line 128. When searching for a specific word, the word is broadcasted to every search-line 116. The match-lines 126 then determine where the word match occurs.

An example of a 4-bit word search is as follows. A specific memory array 202 has 16 content addressable memory cells, with each of the four memory cells in the word-lines 128a, 128b, 128c and 128d storing one bit of information. The four memory cells in the first word-line 128a contains the word "1000", the four memory cells in the second word-line 128b contains the word "0000", the four memory cells in the third word-line 128c contains the word "1101", and the four memory cells in the fourth word-line 128 contains the word "1001". (This means that the PCM element 108aa is in amorphous state '1', the PCM element 110aa is in crystalline state '0', the PCM element 108ab is in crystalline state '0', the PCM element 110ab is in amorphous state '1' and so on.)

The CPU requires the address for the word "1001". First, all the match lines 126a, 126b, 126c and 126d are pre-charged to a high voltage. Then the voltage at search line 116a is set to level '1', at search line 116b to level '0', at search line 116c to level '0' and at search line 116d to level '1'. At the same time, the voltage at the complementary search line 118a is set to level '0', at the complementary search line 118b to level '1', at the complementary search line 118c to level '1' and at the complementary search line 118d to level '0'. The voltage level '1' turns on the search FETs (for instance, FET 112aa and FET 114ab), while the voltage level '0' turns off the search FETs (for instance, FET 114aa and FET 112ab).

The match-line 126a paired to the first word-line 128a discharges at the fourth content addressable memory cell. The match-line 126b paired to the second word-line 128b discharges at the first and the fourth content addressable memory cell. The match-line 126c paired to the third word-line 128c discharges at the second content addressable memory cell. Meanwhile, the match-line 126d paired to the fourth word-line 128d remains pre-charged. This indicates that the search word is located on the fourth word-line 128d.

Having described preferred embodiments for the content addressable memory device (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A content addressable memory cell comprising:
a bit-line configured to supply a data bit;
a complementary bit-line, the complementary bit-line configured to supply a complementary data bit, the complementary data bit being the inverse bit of the data bit;
a phase change memory element including a first end and a second end, the first end of the phase change memory element electrically coupled to the bit-line, the phase change memory element configured to store the data bit;
a complementary phase change memory element including a first end and a second end, the first end of the complementary phase change memory element electrically coupled to the complementary bit-line, the complementary phase change memory element configured to store the complementary data bit;
a search-line access element and a word-line access element electrically coupled in parallel to the second end of the phase change memory element, the search-line access element electrically coupled to a search-line and the word-line access element electrically coupled to a word-line;
a complementary search-line access element and a complementary word-line access element electrically coupled to the second end of the complementary phase change memory element, the complementary search-line access element electrically coupled to a complementary search-line and the complementary word-line access element electrically coupled to the word-line; and
a match-line electrically coupled to the search-line and to the complementary search-line.

2. The content addressable memory cell of claim 1, wherein the data bit and the complementary data bit are binary values.

3. The content addressable memory cell of claim 1, wherein the phase change memory element and the complementary phase change memory element are comprised of a phase change material.

4. The content addressable memory cell of claim 3, wherein the phase change material is Germanium-Antimony-Tellurium (GST).

5. The content addressable memory cell of claim 1, wherein the search-line access element and the complementary search-line access element are field effect transistors (FET).

6. The content addressable memory cell of claim 1, wherein the word-line access element and the complementary word-line access element are bipolar junction transistors (BJT).

7. The content addressable memory cell of claim 1, wherein the word-line access element and the complementary word-line access element are PN junction diodes.

8. The content addressable memory cell of claim 1, wherein the word-line access element and the complementary word-line access element are only activated during data storage.

9. The content addressable memory cell of claim 1, wherein the search-line access element and the complementary search-line access element require less power to operate than the word-line access element and the complementary word-line access element.

10. A content addressable memory device, the content addressable memory device comprising:
a plurality of content addressable memory cells arranged in an array, each content addressable memory cell including a phase change memory element and a complementary phase change memory element, the phase change memory element including a first end and a second end, the complementary phase change memory element including a first end and a second end, the phase change memory element configured to store a data bit, the complementary phase change memory element configured to store a complementary data bit, the complementary data bit being the inverse bit of the data bit;
a plurality of bit-lines and a plurality of word-lines arranged in columns and rows, each bit-line electrically coupled to the first end of at least one phase change memory element;
a plurality of word-line access elements, at least one word-line access element electrically coupled to each word-line, each word-line access element electrically coupled to the second end of one phase change memory element;
a plurality of complementary bit-lines, each complementary bit-line electrically coupled to the first end of at least one complementary phase change memory element;
a plurality of complementary word-line access elements, at least one complementary word-line access element electrically coupled to each word-line, each complementary word-line access element electrically coupled to the second end of one complementary phase change memory element;
a plurality of search-lines, each search-line electrically coupled to at least one search-line access element, the search-line access element electrically coupled to the second end of one phase change memory element;
a plurality of complementary search-lines, each complementary search-line electrically coupled to at least one complementary search-line access element, the complementary search-line access element electrically coupled to the second end of one complementary phase change memory element; and
a plurality of match-lines, the plurality of match-lines electrically coupled to at least one search-line and to the complementary search-line of the at least one search-line.

11. The content addressable memory device of claim 10, wherein the data bit and the complementary data bit are binary values.

12. The content addressable memory device of claim 10, wherein the plurality of phase change memory elements and the plurality of complementary phase change memory elements are comprised of phase change material.

13. The content addressable memory device of claim 12, wherein the phase change material is Germanium-Antimony-Tellurium (GST).

14. The content addressable memory device of claim 10, wherein the search-line access elements and the complementary search-line access elements are field effect transistors (FET).

15. The content addressable memory device of claim 10, wherein the word-line access elements and the complementary word-line access elements are bipolar junction transistors (BJT).

16. The content addressable memory device of claim 10, wherein the word-line access elements and the individual complementary word-line access elements are PN junction diodes.

17. The content addressable memory device of claim 10, wherein the word-line access elements and the complementary word-line access elements are only activated during data storage.

18. The content addressable memory device of claim 10, wherein the search-line access elements and the complementary search-line access elements require less power to operate than the word-line access elements and the complementary word-line access elements.

* * * * *